United States Patent [19]

Yoshihara

[11] Patent Number: 5,369,313
[45] Date of Patent: Nov. 29, 1994

[54] HIGH FREQUENCY GAIN DIFFERENTIAL SIGNAL CIRCUIT EMPLOYING A LEVEL SHIFT DEVICE

[75] Inventor: Kunio Yoshihara, Kawasaki, Japan

[73] Assignee: Kabushiki Kaisha Toshiba, Kawasaki, Japan

[21] Appl. No.: 941,220

[22] Filed: Sep. 4, 1992

[30] Foreign Application Priority Data

Sep. 6, 1991 [JP] Japan ............................. 3-227453

[51] Int. Cl.$^5$ ............. H03K 19/0175; H03K 19/0952
[52] U.S. Cl. .................................... 326/68; 327/333
[58] Field of Search ................ 307/475, 448, 450, 443

[56] References Cited

U.S. PATENT DOCUMENTS

| | | | |
|---|---|---|---|
| 4,558,235 | 12/1985 | White ................................ | 307/450 |
| 4,697,110 | 9/1987 | Masuda et al. .................... | 307/475 |
| 4,712,023 | 12/1987 | Otsuki et al. ..................... | 307/475 |
| 4,785,202 | 11/1988 | Toyoda ............................. | 307/450 |
| 4,798,972 | 1/1989 | Melanson et al. ................ | 307/448 |

OTHER PUBLICATIONS

IEICE Spring Conference, C–507, Mar. 1991, K. Yoshihara, et al. "Design And Evaluation of I/O Circuits For 8 Bit MUX/DEMUX."
Electronic Circuts: Discreet and Integrated, Second Edition, D. L. Schilling, et al., 1979, pp. 322–327. "Electronic Circuit For Transistor And IC, Analog Part."

*Primary Examiner*—Edward P. Westin
*Assistant Examiner*—Jon Santamauro
*Attorney, Agent, or Firm*—Oblon, Spivak, McClelland, Maier & Neustadt

[57] ABSTRACT

According to this invention, level shift diodes and are connected between input nodes and output nodes through source follower MESFETs, and the output nodes are connected to a power supply through current source MESFETs and current supply resistors, thereby forming first and second level shift circuit units. A DC bias is applied to the gates of the current source MESFETs through resistors. At the same time, signals having phases opposite to input signals of the current source MESFETs are supplied to the current source MESFETs through capacitors, respectively. A current supply circuit has a gain in a high-frequency range.

11 Claims, 5 Drawing Sheets

HIGH FREQUENCY GAIN DIFFERENTIAL SIGNAL CIRCUIT EMPLOYING A LEVEL SHIFT DEVICE

BACKGROUND OF THE INVENTION

1. Field of the Invention

The present invention relates to a level shift circuit used in a semiconductor integrated circuit.

2. Description of the Related Art

Various level shift circuits are generally used in an electronic circuits. In a classic AC amplifier, DC cutoff capacitors are arranged between stages, and a DC bias is applied to each of the stages again. However, in a DC amplifier or a logic circuit, unlike in an AC amplifier, a DC component cannot be cut. For this reason, a level shift element or a cascode amplifier using forward voltage drop-of a diode, or a combination circuit thereof is used to shift a DC level (e.g., Donald L. Siring and Charles Birave, translated by Toyohiko Okabe, Koichi Usami, "Electronic Circuit for Transistor and IC, Analog part" pp. 322–327).

Figure 1:
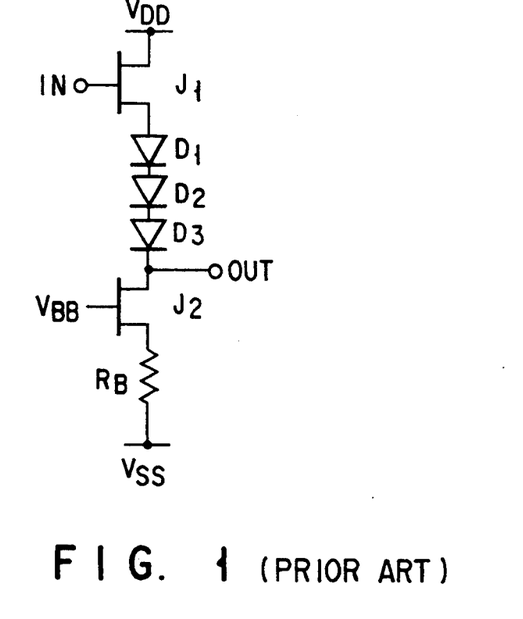
FIG. 1 is a circuit diagram showing a conventional level shift circuit.

FIG. 1 shows a conventional level shift circuit used in an SCFL logic integrated circuit using a GaAs MESFET. This level shift circuit consists of a source follower MESFET $J_1$, diodes $D_1$ to $D_3$ used as level shift elements, a current source MESFET $J_2$, and a current supply resistor $R_B$.

Figure 2:
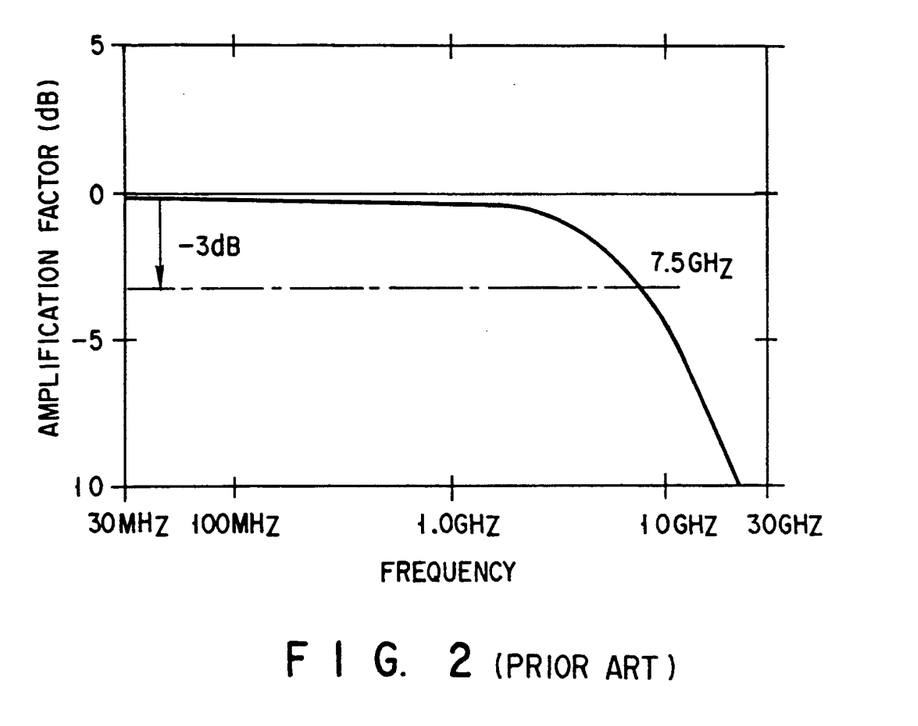
FIG. 2 is a graph showing gain-frequency characteristics of the conventional level shift circuit shown in FIG. 1.

This conventional level shift circuit has insufficient high-frequency characteristics. The level shift circuit shifts only a DC level, and it has no AC gain. However, since the frequency characteristics of the level shift circuit are not good, as shown in FIG. 2, the level shift circuit attenuates a high-frequency signal to adversely affect the high-frequency characteristics of a whole circuit including circuits other than the level shift circuit.

As a method of improving the high-frequency characteristics of such a level shift circuit, the following method is known. That is, the sizes of the MESFETs $J_1$ and $J_2$ are increased, and a large current is caused to flow in the level shift circuit. However, when the large current flows in the level shift circuit, the power consumption of the integrated circuit chip is increased in accordance with the current value. This is against a demand for decreasing power consumption of an integrated circuit. In fact, in a conventional SCFL logic integrated circuit or an ECL logic integrated circuit, the half of the power of the chip is consumed by a level shift circuit (e.g., Yoshihara, Konno, Kitaura, Ishida, and Shimizu, "Design and Evaluation of 10-GHz 8-bit MUX/DEMUX-Input/Output Circuit", the Institute of Electronics and Information Communication Engineers of Japan, national conference proceedings, 1991, C-507, pp. 5–98).

As described above, in an integrated circuit having a conventional level shift circuit, high-frequency characteristics and low power consumption characteristics are traded off, and the relationship therebetween is desired to be improved.

SUMMARY OF THE INVENTION

It is an object of the present invention to provide a level shift circuit whose high-frequency characteristics are remarkably improved without an increase in power consumption.

According to the present invention, a level shift circuit is characterized by comprising at least one level shift element, having first and second terminals, for shifting a DC level of an input signal supplied to said first terminal, a resistor having one terminal and the other terminal applied with a DC bias, a current source transistor having a drain connected to said second terminal and a gate connected to the other terminal of said resistor and applied with the DC bias through said resistor, and a capacitor having one terminal connected to the gate of said current source transistor and the other terminal for receiving a signal having a phase opposite to that of the signal supplied to said first terminal.

In addition, the capacitor used in the present invention is formed on an input line for a signal.

According to the present invention, when a signal having a phase opposite to that of the input signal supplied to the level shift circuit is supplied to the control terminal of the current source transistor through the capacitor, the current supply circuit serves as an amplifier having a gain with respect to a high-frequency signal. When an appropriate value of the capacitor is selected, the current supply circuit has a necessary gain in only a high-frequency range. A DC bias is applied to the control terminal of the transistor through a resistor, and a signal is transmitted through the level shift element in a low-frequency range without any gain as in a conventional circuit. Therefore, according to the present invention, the high-frequency characteristics of the level shift circuit can be effectively improved without a large increase in power consumption.

In addition, according to the present invention, since the capacitor for improving high-frequency characteristics is formed on a path which is originally required as an input line (drawn line), an electrostatic capacitance required for the circuit can be obtained without an increase in unnecessary capacitance to ground. Furthermore, according to the present invention, since the input line is formed to match 50 Ω and has a thickness larger than that of an internal line, an area for the capacitor can be easily obtained. When the capacitor is to be formed on a semiconductor substrate as described above, an electrode layer (first layer) for external input is formed first, and a metal layer (second layer) led to an internal gate is formed on the first layer through a dielectric, thereby advantageously decreasing the capacitance to ground on the internal electrode side (second layer).

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which.

DETAILED DESCRIPTION OF THE PREFERRED EMBODIMENTS

Embodiments of the present invention will be described below with reference to the accompanying drawings.

Figure 3:
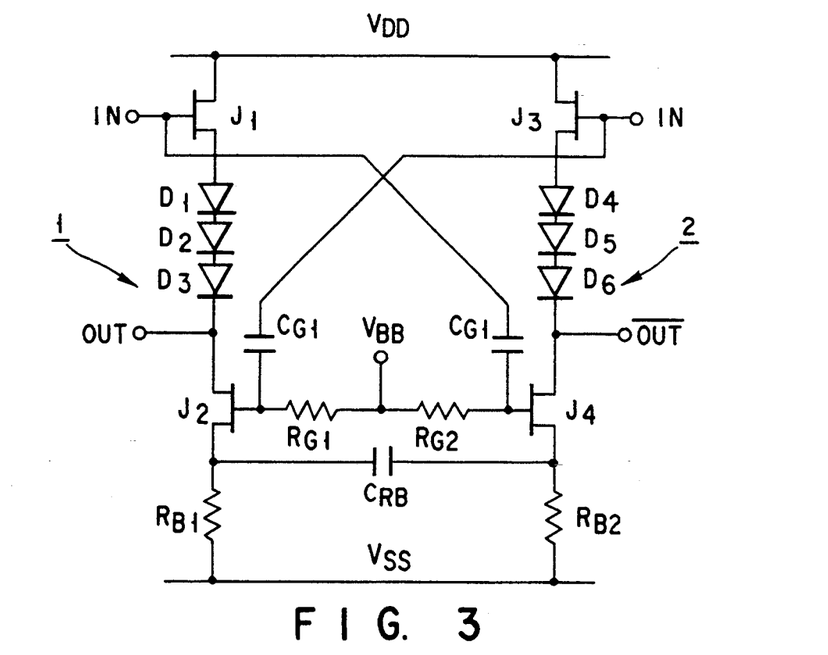
FIG. 3 is a circuit diagram showing a differential level shift circuit according to the first embodiment of the present invention.

FIG. 3 shows a level shift circuit in a differential signal GaAs integrated circuit according to the first embodiment of the present invention. Since the circuit in the first embodiment is a differential signal circuit, the circuit has first and second level shift circuit units 1 and 2.

In the first level shift circuit unit 1, the gate of a source follower MESFET $J_1$ is connected to an input node (first node) to which a signal is supplied from the previous stage, and the source of the source follower MESFET $J_1$ is connected to an output node (second node) OUT through diodes $D_1$ to $D_3$ serving as level shift elements. The drain of the MESFET $J_1$ is connected to an "H"-level power supply $V_{DD}$. A current source MESFET $J_2$ and a current supply resistor $R_{B1}$ are connected between the output node OUT and an "L"-level power supply Vss. A DC bias $V_{BB}$ is applied to the gate terminal of the MESFET $J_2$.

In the second level shift circuit unit 2, as in the first level shift circuit unit 1, a source follower MESFET $J_3$, level shift diodes $D_4$ to $D_6$, a power supply MESFET $J_4$, and a current supply resistor $R_{B2}$ are arranged between an input node/IN and an output node/OUT.

The basic arrangements of the first and second level shift circuit units 1 and 2 are not different from that of a conventional level shift circuit. All the MESFETs $J_1$ to $J_4$ used in the first embodiment are of a D type. In the first embodiment, a capacitor $C_{G1}$ is arranged between the input node/IN of the second level shift circuit unit 2 and the gate of the current source MESFET $J_2$ of the first level shift circuit unit 1. Similarly, a capacitor $C_{G2}$ is arranged between the input node IN of the first level shift circuit unit 1 and the gate of the current source MESFET $J_4$ of the second level shift circuit unit 2. That is, in the first level shift circuit unit 1, the signal having a phase opposite to that of a signal supplied to the input node IN is supplied to the gate of the current source MESFET $J_2$ through the capacitor $C_{G1}$. In the second level shift circuit unit 2, a signal having a phase opposite to that of a signal supplied to the input node /IN is supplied to the gate of the current source MESFET $J_4$ through the capacitor $C_{G2}$. In addition, resistors $R_{G1}$ and $R_{G2}$ are arranged between the current source MESFET $J_2$ and the DC bias $V_{BB}$ and between the current source MESFET $J_4$ and the DC bias $V_{BB}$, respectively.

A capacitor $C_{RB}$ is arranged between the sources of the two current source MESFETs $J_2$ and $J_4$. The capacitor $C_{RB}$ is arranged to suppress a negative feedback effect caused by the current supply resistors $R_{B1}$ and $R_{B2}$ in a high-frequency range. That is, since the MESFETs $J_2$ and $J_4$ have voltage gains in the high-frequency range, the negative feedback effect occurs due to the current supply resistors $R_{B1}$ and $R_{B2}$. If this negative feedback is large, a desirable gain cannot be obtained.

Although all the MESFETs used in the first embodiment are of a D type, the MESFETs may be of an E type in the first embodiment.

In the level shift circuit in the first embodiment, when an "H"-level signal is supplied to the input node IN, an "L"-level signal of the input node is supplied to the gate of the current source MESFET $J_2$ of the first level shift circuit unit 1 through the capacitor $C_{G1}$. In contrast to this, when an "L"-level signal is supplied to the input node IN, an "H"-level signal is supplied to the gate of the current source MESFET $J_2$ through the capacitor. That is, the conductance of the current source MESFET $J_2$ is controlled in response to an input signal, and this current supply circuit unit has a gain amplifying function with respect to a high-frequency signal. However, since the impedance of the capacitor $C_{G1}$ is increased in a low-frequency range, the above amplifying function is degraded. The second level shift circuit unit has the same operation as that of the first level shift circuit unit.

As described above, in the level shift circuit in the first embodiment, since the current supply unit has a gain in a high-frequency range, high-frequency characteristics are improved.

Figure 4:
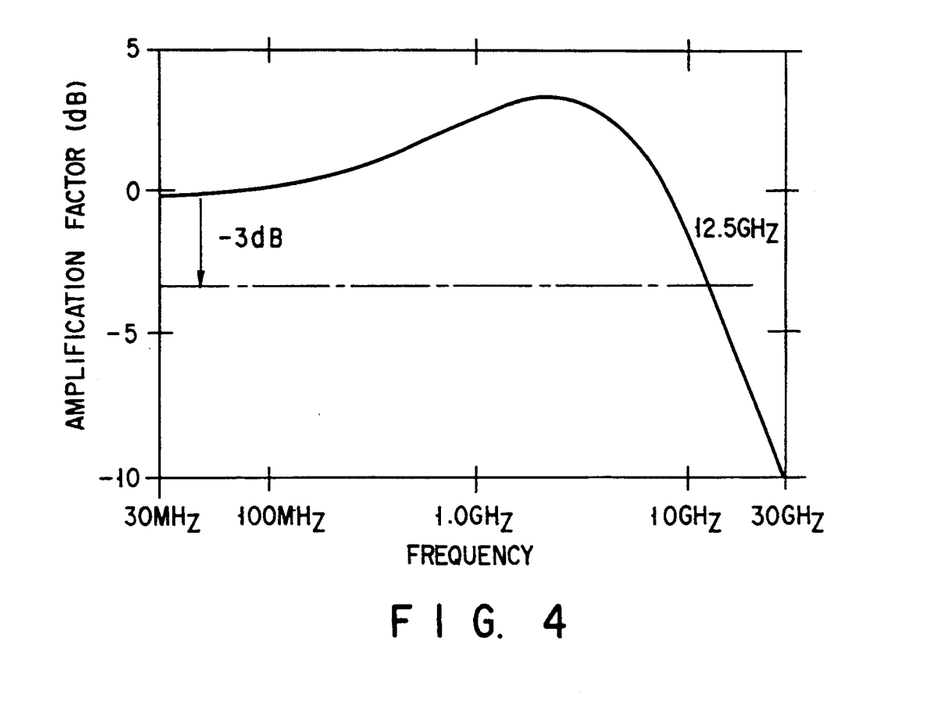
FIG. 4 is a graph showing gain-frequency characteristics of the level shift circuit in FIG. 3.

FIG. 4 is a graph showing the frequency characteristics of the level shift circuit in the first embodiment. The parameters of the elements of the level shift circuit are as follows.

| | |
|---|---|
| MESFETs $J_1$ and $J_3$ | channel length, 0.5 μm; channel width, 28 μm; and threshold voltage −0.2 V |
| MESFETs $J_2$ and $J_4$ | channel length, 0.5 μm; channel width, 28 μm; and threshold voltage −0.2 V |
| capacitors $C_{G1}$ and $C_{G2}$ | 100 fF |
| capacitor $C_{RG}$ | 500 fF |
| resistors $R_{G1}$ and $R_{G2}$ | 2 kΩ |
| resistors $R_{B1}$ and $R_{B2}$ | 107 Ω |
| power supply $V_{DD}$ = 0 V, power supply Vss = −5.2 V | |

Data in FIG. 4 is obtained when load conditions are the same as those of the prior art in FIG. 2 and power consumption is almost half the power consumption of the prior art in FIG. 2 (i.e., the data in FIG. 4 is obtained when the channel width of the MESFET is ½ that of the MESFET of the prior art). When an amplification factor is −3 dB, a frequency is 7.5 GHz in the prior art in FIG. 2, but a frequency is 12.5 GHz in the first embodiment. As a result, the frequency of the first embodiment is improved by about 67%.

Figure 5:
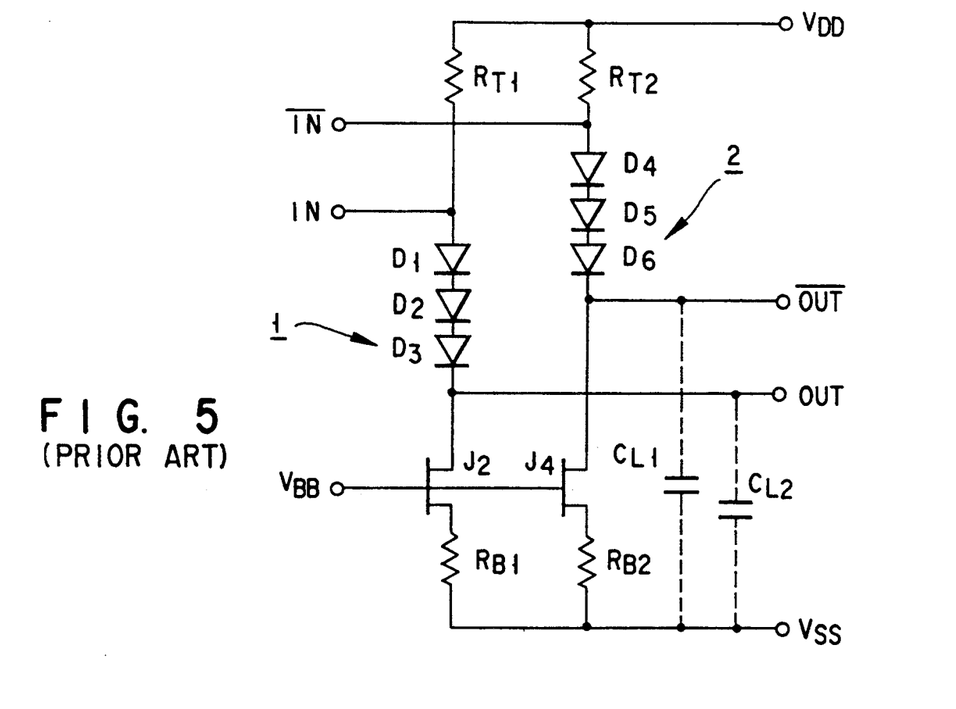
FIG. 5 is a circuit diagram showing a conventional differential level shift circuit having a terminal resistor.

At an extra high-frequency range, even in a digital integrated circuit, the impedances of an input terminal and a transmitting line must be matched with each other. More specifically, in an integrated circuit having a frequency range of about 10 GHz, a matching terminal resistor is frequently formed on the chip. In the input circuit, a level shift circuit for eliminating a difference between an external interface level and an internal logic level is required. FIG. 5 shows a level shift circuit having a terminal resistor used for the above application. The level shift circuit in FIG. 5 has a differential circuit arrangement, two input nodes IN and /IN are connected to the power supply $V_{DD}$ through terminal resistors $R_{T1}$ and $R_{T2}$, respectively. This circuit has no source follower transistor, and the input nodes IN and /IN are directly connected to level shift diodes $D_1$ and $D_4$, respectively.

Figure 6:
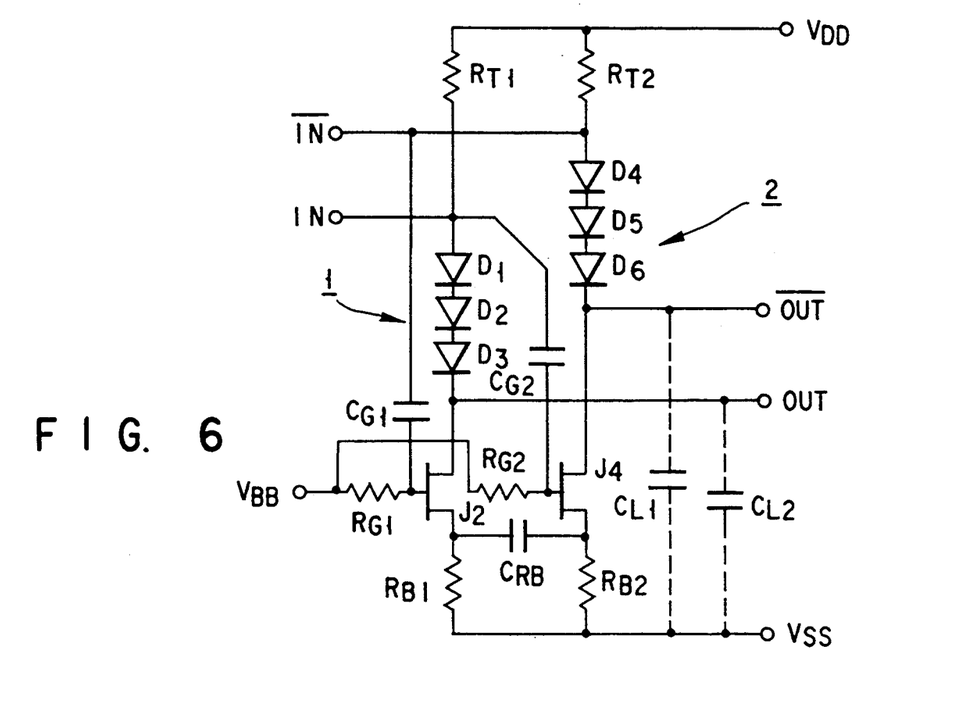
FIG. 6 is a circuit diagram showing the second embodiment in which the present invention is applied to the circuit in FIG. 5.

FIG. 6 shows the second embodiment in which the present invention is applied to a level shift circuit having a terminal resistor described above. As in the first embodiment, signals having opposite phases are supplied to the gates of current source MESFETs $J_2$ and $J_4$ of first and second level shift circuit units 1 and 2 through capacitors $C_{G1}$ and $C_{G2}$, respectively.

Although the MESFETs $J_2$ and $J_4$ are of a D type in the second embodiment, the MESFETs may be of an E type in the second embodiment.

Figure 7:
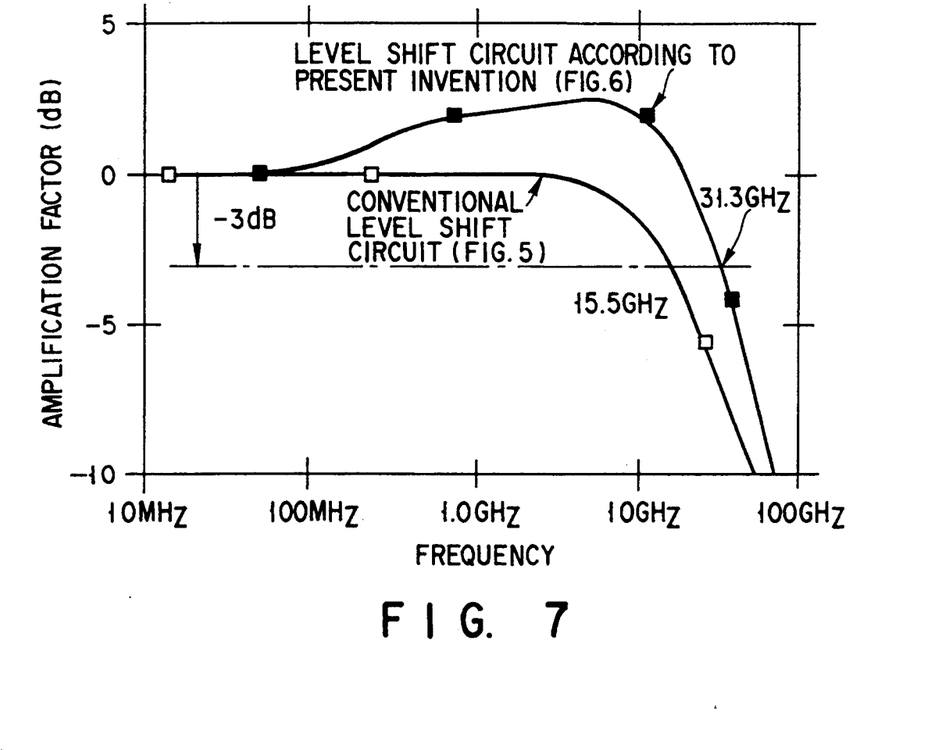
FIG. 7 is a graph showing gain-frequency characteristics of the circuit in FIG. 6.

FIG. 7 shows a result obtained by comparing frequency characteristics of the conventional circuit in FIG. 5 and the circuit in FIG. 2 under the same conditions of load and power consumption. When a amplification factor is $-3$ dB, a frequency is 15.5 GHz in the conventional circuit, and a frequency is 31.3 GHz in the circuit of the second embodiment. As a result, the frequency of the second embodiment is twice or more the conventional circuit. In the second embodiment, although a gain begins to rise near 100 MHz, since it works to compensate for the frequency characteristics of a circuit connected to the output of the circuit of the second embodiment, it is not disadvantageous. An increase in gain of a digital signal circuit in a high-frequency range often appears as ringing at the leading and trailing edges of a signal. However, the increase in gain to this extent does not cause the ringing due to the high-frequency characteristics of the previous and subsequent circuits, and the rise time and fall time of the signal are advantageously shortened.

Figure 8:
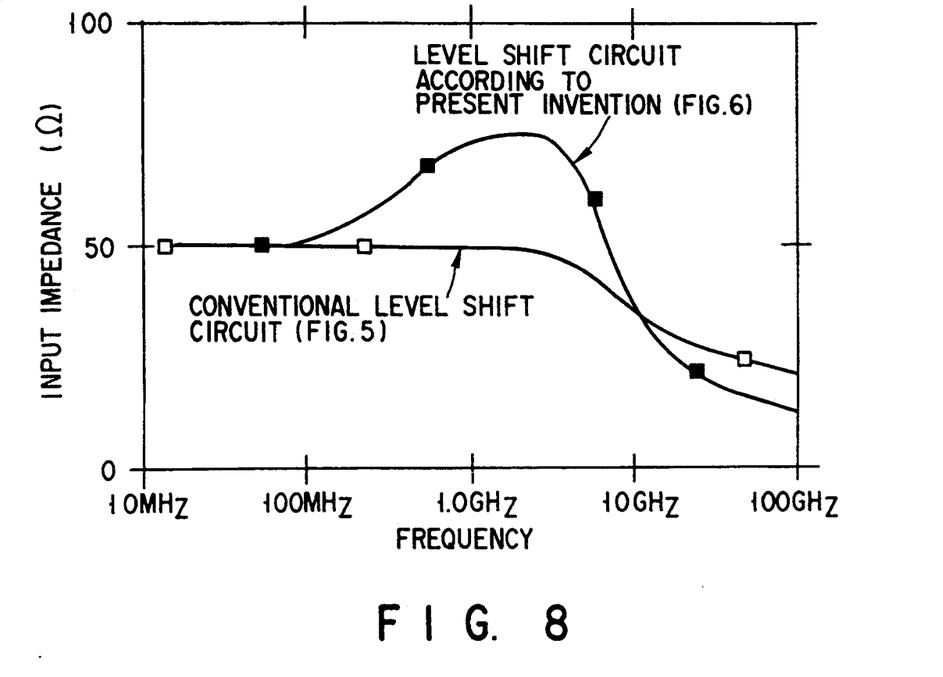
FIG. 8 is a graph showing input impedance-frequency characteristics of the circuit in FIG. 6.

FIG. 8 shows the frequency characteristics of the input impedances of the conventional circuit in FIG. 5 and the circuit in the second embodiment. In the second embodiment, as shown in FIG. 8, an input impedance rises in a high-frequency range. This is obtained by controlling the conductances of the current source MESFETs $J_2$ and $J_4$ and is effective to an increase in gain of the circuit.

Figure 9:
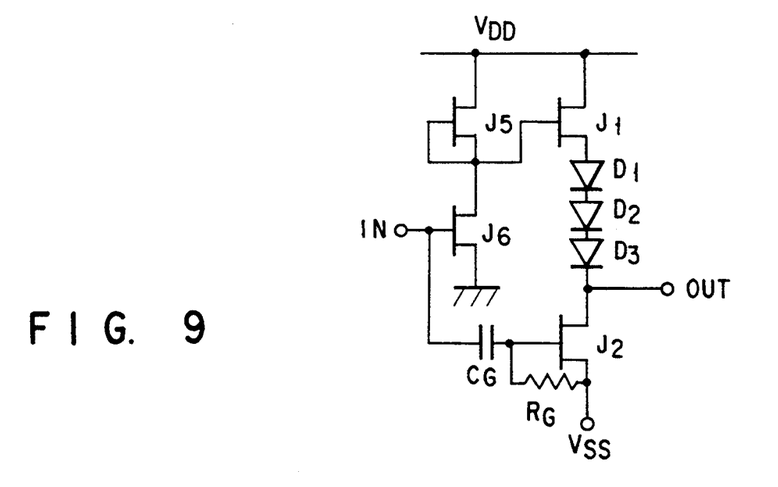
FIG. 9 is a circuit diagram showing the third embodiment in which the present invention is applied to a single-end level shift circuit.

FIG. 9 is a circuit diagram showing the third embodiment in which the present invention is applied to a single-end level shift circuit. In the single-end level shift circuit, as shown in FIG. 9, an input signal of the input node of a DCFL inverter amplifier stage consisting of a D type load MESFET $J_5$ and an E type driver MESFET $J_6$ which are connected to the input of a level shift stage must be supplied to the gate of a current source MESFET $J_2$ of the level shift stage through a capacitor CG. The current source MESFET $J_2$ is of a D type, and a source follower MESFET $J_1$ may be of a D or E type.

In the third embodiment, as in the first and second embodiments, the current source MESFET $J_2$ has a gain in a high-frequency range, and the frequency characteristics of the level shift circuit are improved.

In the first to third embodiments, capacitors are used to improve frequency characteristics in a high-frequency range. An arrangement of the capacitors used in the level shift circuit of the present invention will be described below.

When the capacitors are to be formed on a semiconductor chip (especially, on a semi-insulating substrate such as a GaAs substrate), an electrostatic capacitance between metal lines is generally used. However, in this method, a predetermined area is required to obtain a proper capacitance. When this area is obtained, not only an originally required electrostatic capacitance between layers but an unnecessary capacitance to ground are increased, so that the performance of the level shift circuit may be degraded.

Figure 10A:
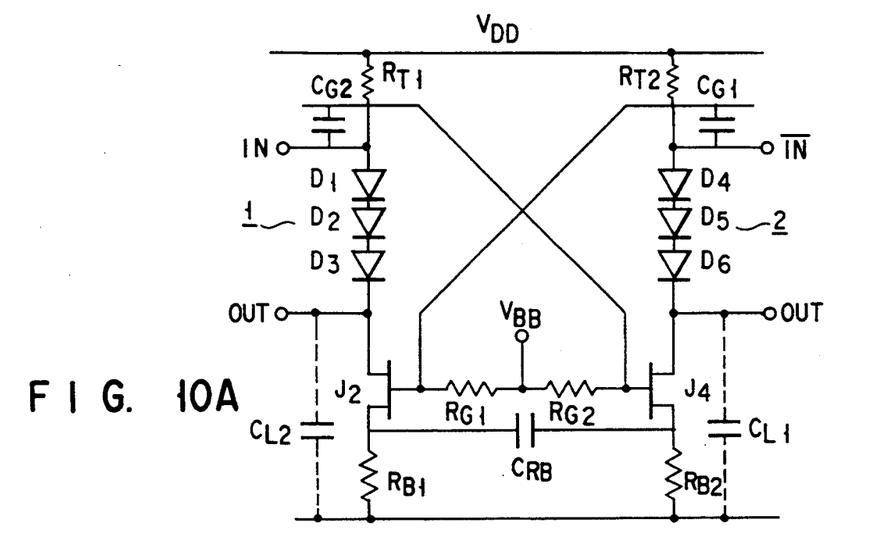
FIGS. 10A and 10B are a circuit diagram and a perspective view, respectively, showing an arrangement of capacitors according to the present invention.
Figure 10B:
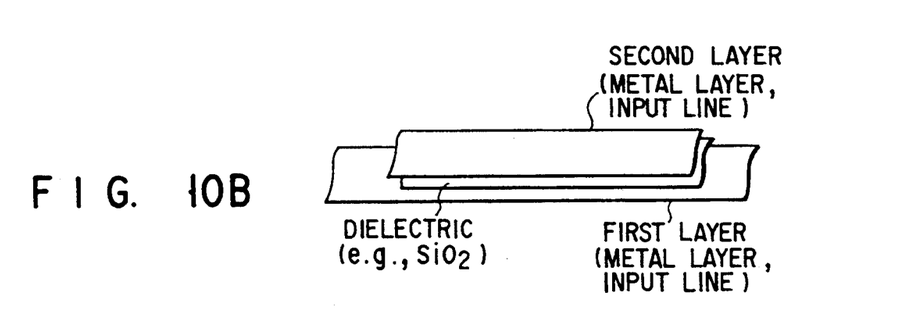

According to the present invention, in a level shift circuit having a terminal resistor in FIG. 6, for example, a capacitor $C_{G2}$ is formed on a semiconductor chip as follows. This manner is shown in FIGS. 10A and 10B. A circuit in FIG. 10A is the same as that in FIG. 6, and FIG. 10A shows that a capacitor $C_{G1}$ and the capacitor $C_{G2}$ are formed on input lines, respectively.

As shown in FIG. 10A, the capacitors $C_{G1}$ and $C_{G2}$ are formed on the input lines (drawn lines) of input nodes /IN and IN, respectively, and one terminal of each of the capacitors serves as one of the input lines. The other terminal (second layer) of each of the capacitors $C_{G1}$ and $C_{G2}$, as shown in FIG. 10B, is formed on a corresponding one of the input lines through a dielectric (e.g., $SiO_2$) and connected to the gate of the current source MESFET $J_4$. As described above, according to the present invention, a capacitor for improving high-frequency characteristics is formed on the line which is originally required as an input line. An electrostatic capacitance required for the circuit can be obtained without an increase in unnecessary capacitance to ground.

In addition, according to the present invention, the input line is formed to be matched with $50\Omega$, and it has a thickness larger than that of an internal line. For this reason, a large area for a capacitor can be easily obtained. Furthermore, as described above, when a capacitor is to be formed on a semiconductor substrate, an electrode layer (first layer) for external input is formed first, and a metal layer (second layer) led to an internal gate is formed on the first layer through a dielectric, thereby advantageously decreasing the capacitance to ground on the internal electrode side (second layer).

The present invention is not limited to the above embodiments.

In the embodiments, a level shift circuit is exemplified by an integrated circuit using a MESFET. However, the present invention can be similarly applied to a level shift circuit in a MOS integrated circuit or a bipolar integrated circuit. The level shift element is not limited to a diode, transistors or resistors which are diode-connected may be used as the level shift elements. When the resistors are used as level shift elements, a time constant circuit is formed between a load capacitor and the resistors to degrade high-frequency characteristics. However, when the present invention is applied, the degradation in the high-frequency characteristics can be compensated. The level shift element may include an inductor. When the level shift element includes the inductor, since a high-frequency impedance is increased, a high-frequency gain can be obtained.

In above embodiments, the DC bias is applied to the control terminal of the transistor through the resistor, induced reactance elements such as coils can be used in place of the resistors.

Various modifications of the present invention may be effected without departing from the spirit and scope of the present invention.

What is claimed is:

1. A level shift circuit comprising:
   at least one level shift element, having first and second terminals, for shifting a DC level of an input signal supplied to said first terminal;
   a resistor having one terminal and an other terminal applied with a DC bias;
   a current source transistor having a drain connected to said second terminal of said level shift element and a gate connected to the other terminal of said resistor and applied with the DC bias through said resistor; and
   a capacitor having one terminal connected to the gate of said current source transistor and an other terminal for receiving a signal having a phase opposite to that of the signal supplied to said first terminal,
   wherein the capacitor and the resistor have values chosen such that the level shift circuit amplifies only having a high frequency not less than 100 MHz.

2. A circuit according to claim 1, wherein said level shift element comprises a diode element.

3. A level shift circuit comprising:
   at least one level shift element, having first and second terminals, for shifting a DC level of a signal supplied to said first terminal;
   a current source transistor having a drain connected to said second terminal of said level shift element;
   a capacitor having one terminal connected to a gate of said current source transistor and an other terminal for receiving a signal having a phase opposite to that of the signal supplied to said first terminal; and
   a resistor having one terminal connected to the gate of said current source transistor and an other terminal connected to a source of said current source transistor,
   wherein the capacitor and the resistor have values chosen such that the level shift circuit amplifies only input signal having a high frequency not less than 100 MHz.

4. A level shift circuit comprising:
   a semiconductor substrate;
   an input line, formed on said semiconductor substrate, for receiving a predetermined signal;
   at least one level shift element, having first and second terminals, for shifting a DC level of an input signal supplied to said first terminal, said first terminal being connected to said input line;
   a resistor having one terminal and an other terminal applied with a DC bias;
   a current source transistor having a drain connected to said second terminal of said level shift element and a gate connected to the other terminal of said resistor and applied with the DC bias through said resistor; and
   a capacitor having one terminal connected to the gate of said current source transistor and an other terminal for receiving a signal having a phase opposite to that of the signal supplied to said first terminal,
   wherein the capacitor and the resistor have values chosen such that the level shift circuit amplifies only input signals having a high frequency not less than 100 MHz,
   wherein said capacitor comprises a first electrode formed by said input line formed on said substrate, an insulating layer formed on said input line, and a second electrode formed on said insulating layer.

5. A level shift circuit comprising:
   at least one level shift element, having first and second terminals, for shifting a DC level of an input signal supplied to said first terminal;
   a resistor having one terminal and an other terminal applied with a DC bias;
   a current source transistor having a drain connected to said second terminal of said level shift element and a gate connected to the other terminal of said resistor and applied with the DC bias through said resistor;
   a first capacitor having one terminal connected to the gate of said current source transistor and an other terminal for receiving a signal having a phase opposite to that of the signal supplied to said first terminal; and
   a second capacitor having one terminal connected to the source terminal of said current source transistor and an other terminal connected to a source terminal of another current source transistor in another level shift circuit, said second capacitor for suppressing a negative feedback effect caused by said resistor.

6. A circuit according to claim 5, wherein said level shift element comprises a diode element.

7. A level shift circuit comprising:
   at least one level shift element, having first and second terminals, for shifting a DC level of a signal supplied to said first terminal;
   a current source transistor having a drain connected to said second terminal of said level shift element;
   a first capacitor having one terminal connected to a gate of said current source transistor and an other terminal for receiving a signal having a phase opposite to that of the signal supplied to said first terminal;
   a second capacitor having one terminal connected to the source terminal of said current source transistor and an other terminal connected to a source terminal of another current source transistor in another level shift circuit, said second capacitor for suppressing a negative feedback effect caused by a resistor; and
   said resistor having one terminal connected to the gate of said current source transistor and an other terminal connected to a source of said current source transistor.

8. A level shift circuit comprising:
   a semiconductor substrate;
   an input line, formed on said semiconductor substrate, for receiving a predetermined signal;
   at least one level shift element, having first and second terminals, for shifting a DC level of an input signal supplied to said first terminal, said first terminal being connected to said input line;
   a resistor having one terminal and an other terminal applied with a DC bias;
   a current source transistor having a drain connected to said second terminal of said level shift element and a gate connected to the other terminal of said resistor and applied with the DC bias through said resistor;

a first capacitor having one terminal connected to the gate of said current source transistor and an other terminal for receiving a signal having a phase opposite to that of the signal supplied to said first terminal, wherein said first capacitor comprises a first electrode formed by said input line formed on said substrate, an insulating layer formed on said input line, and a second electrode formed on said insulating layer; and a second capacitor having one terminal connected to the source terminal of said current source transistor and another terminal connected to a source terminal of another current source transistor in another level shift circuit, said second capacitor for suppressing a negative feedback effect caused by said resistor.

9. A circuit according to claim 1, wherein said input signal is an analog signal and a waveform of the analog signal is shaped by adjusting a CR differential circuit constructed by said resistor and said capacitor.

10. A circuit according to claim 3, wherein said input signal is an analog signal and a waveform of the analog signal is shaped by adjusting a CR differential circuit constructed by said resistor and said capacitor.

11. A circuit according to claim 4, wherein said input signal is an analog signal and a waveform of the analog signal is shaped by adjusting a CR differential circuit constructed by said resistor and said capacitor.

* * * * *